United States Patent [19]
Solomon

[11] Patent Number: 5,126,684
[45] Date of Patent: Jun. 30, 1992

[54] DIGITAL POWER AMPLIFIER

[75] Inventor: Elias E. Solomon, Duxbury, Mass.

[73] Assignee: Potter Electrical Signal Company, St. Louis, Mo.

[21] Appl. No.: 663,744

[22] Filed: Mar. 4, 1991

[51] Int. Cl.⁵ .............................................. H03F 3/38
[52] U.S. Cl. ...................................... 330/10; 330/251
[58] Field of Search ................... 330/10, 207 A, 146, 330/251; 318/678, 681, 684

[56] References Cited

U.S. PATENT DOCUMENTS

| | | | |
|---|---|---|---|
| 3,579,132 | 5/1971 | Ross | 330/251 |
| 4,146,828 | 3/1979 | Ross et al. | 318/681 X |
| 4,689,819 | 8/1987 | Killion | 330/251 X |

*Primary Examiner*—James B. Mullins
*Attorney, Agent, or Firm*—Wolf, Greenfield & Sacks

[57] ABSTRACT

In a digital power amplifier, a high frequency linear modulated driving signal is used to control a bridge circuit arrangement of transistors. By inputting this high frequency linear modulated signal to a bridge arrangement of driving comparators, a controlled dead band is created and a balanced output is obtained from the bridge circuit arrangement of transistors. The balanced output signal is then fed through a filter circuit for demodulation. An alternative embodiment of the invention employs a bridge circuit consisting of transistors connected in parallel for improved power handling capabilities.

17 Claims, 8 Drawing Sheets

Fig.3
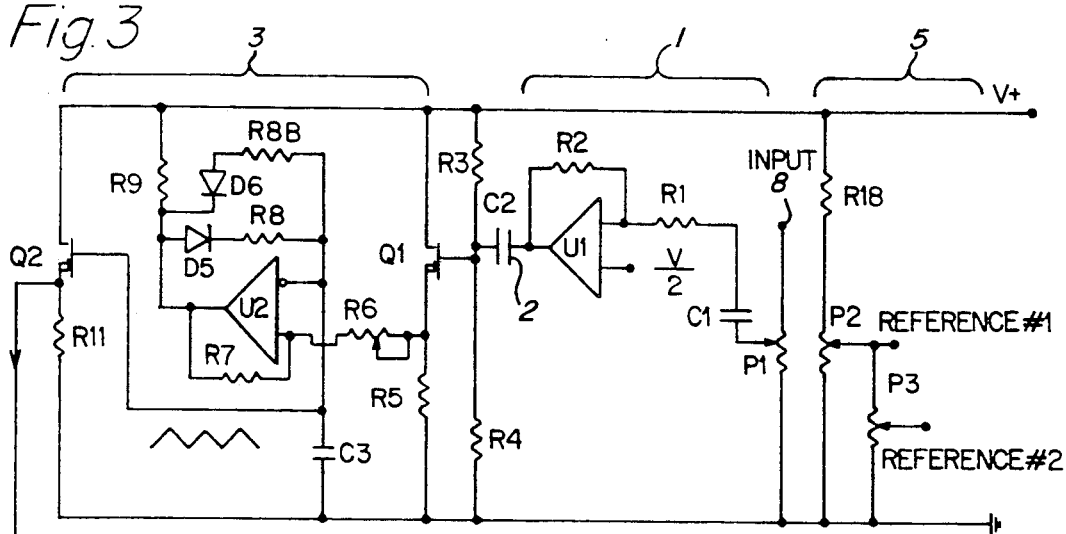
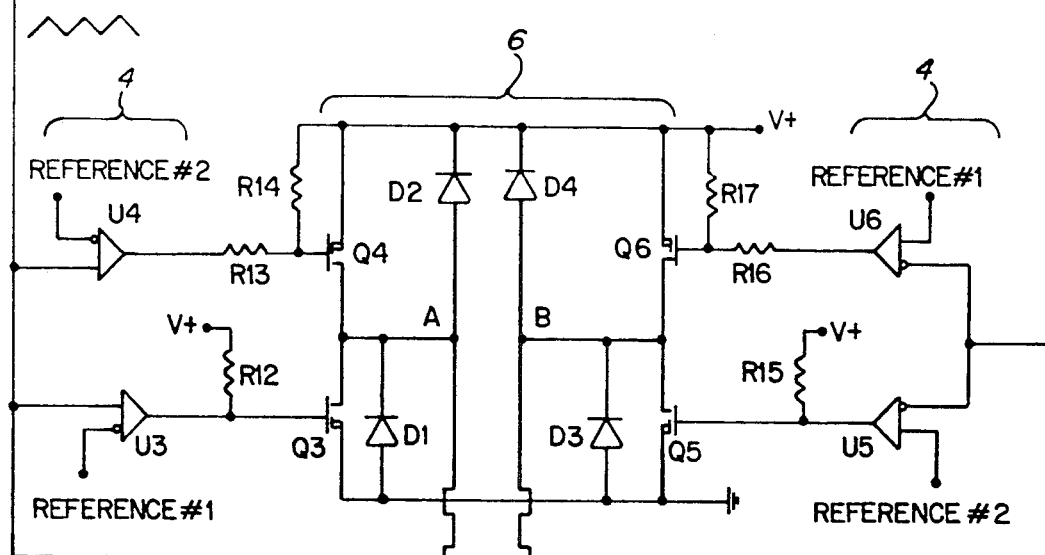
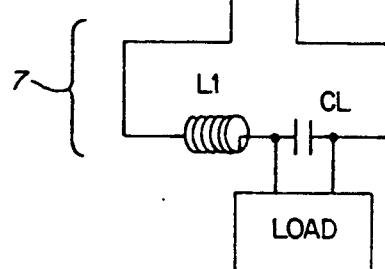

Fig.10

| INPUT VOLTS | COMPARATORS | | | | DRIVER OUTPUTS | | | | |
|---|---|---|---|---|---|---|---|---|---|
| | U3 | U4 | U5 | U6 | Q3 | Q4 | Q5 | Q6 | |
| 0 | 0 | 0 | 1 | 0 | 1 | 1* | 0* | 0 | |
| 1.99 | 0 | 0 | 1 | 0 | 1 | 1 | 0 | 0 | DEAD BAND |
| 2 | 0 | 1 | 0 | 0 | 0 | 0 | 0 | 0 | DEAD BAND |
| 2.99 | 0 | 1 | 0 | 0 | 0 | 0 | 0 | 0 | |
| 3 | 1 | 1 | 0 | 1 | 0* | 0 | 1 | 1* | |

* INDICATES CONDUCTING TRANSISTORS. Q3 AND Q5 ARE "N" CHANNEL DEVICES. Q4,Q6 ARE "P" CHANNEL DEVICES.

DIGITAL POWER AMPLIFIER

BACKGROUND OF THE INVENTION

1. Field of the Invention

The present invention relates generally to a digital power amplifier and pertains, more particularly, to a digital power amplifier which utilizes a high frequency linear modulated driving signal. Even more particularly, the invention relates to a digital power amplifier which inputs a high frequency modulated linear signal to the drivers of a bridge circuit to obtain a balanced output.

2. Background Discussion

There are many different types of power amplifiers. Most power amplifiers are of the linear or analog type. Linear amplifiers fall into one of the following classifications: A, AB, B and C. These linear amplifiers provide the function of increasing and amplifying both voltage and power capabilities of a circuit. Due to the fact that these amplifiers operate in the linear region, they have low efficiencies and dissipate a considerable amount of heat. The following table lists the approximate efficiency for each class of amplifier:

| Type | Efficiency |
| --- | --- |
| Class A | 20% |
| Class AB | 40% |
| Class B | 40%-60% |
| Class C | 60%-80% |

The distortion increases with increasing efficiency which means that one has to sacrifice distortion for efficiency or visa versa. In addition, the efficiency of the linear power amplifier is reduced when a coupling transformer is used to drive an output load, which is common.

Digital amplifiers are more efficient than linear or analog amplifiers. Class D digital amplifiers are well-known in the art and prior art Class D digital amplifiers employ pulse width-modulation techniques. The circuits employed utilize a fixed ramp or sawtooth waveform for providing a threshold voltage level as one input of a comparator. The audio or other signal, to be amplified, is connected to the other input of the comparator. The output of the comparator is switched when the input signal exceeds the sawtooth threshold signal. While more efficient than linear amplifiers, digital amplifiers tend to be very complex and expensive. In addition, component or inherent signal variations of the circuit may cause efficiency and distortion problems.

In prior art digital amplifiers, such as those used for motor control, digital signals are used to drive the bridge circuit or equivalent portion of the amplifier. Digital signals are used as inputs to driving comparators. This causes problems due to the uncertainty of the threshold level of the comparator, as well as the complexity and relative lack of control that the digital signal provides. A digital signal is either on or off. When a digital signal is applied as an input to a bridge circuit arrangement of driving comparators, which in turn drive a bridge circuit of transistors, no dead band exists and cross conduction between complimentary transistor pairs results. When such cross conduction occurs between complimentary transistor pairs in a bridge circuit, an unbalanced, uncontrollable output results. Prior art embodiments have attempted to resolve this phenomenon by using circuit combinations including delay circuits, flip flops and comparators; a complex, expensive, and unreliable solution.

Accordingly, it is an object of the present invention to provide a more simplified and inexpensive power amplifier which operates at extremely high efficiencies.

Another object of the present invention is to provide a power amplifier which, while operating at extremely high frequencies, dissipates very little heat and operates with extremely low distortion.

Another object of the present invention is to provide a digital power amplifier which transmits analog signals and provides a means for adjusting the output waveform to compensate for component or inherent signal variations of the circuit.

Another object of the present invention is to provide a digital power amplifier which need not require using a digital signal as the input to the driver of a bridge circuit.

Another object of the present invention is to provide a digital power amplifier which utilizes a bridge circuit arrangement of transistors, in which a dead band exists with no cross conduction between the complimentary transistor pairs.

A final object of the present invention is to provide a power amplifier which avoids using complex circuity while very simply providing an infinitely controlled dead band to suit the characteristics of the bridge circuit

SUMMARY OF THE INVENTION

To accomplish the foregoing and other objects, features and advantages of the invention, there is provided an improved digital power amplifier which comprises a means for receiving an analog input signal to be amplified. This analog input signal is fed to a modulator means for modulating the input signal. The modulating means has an oscillator means for generating a modulated linear periodic signal which is dependent upon a reference voltage, wherein the reference voltage changes value when the oscillator means changes state. A driver means receives the modulated linear periodic signal from the modulator mean and produces controlled digital signals which are dependent upon the modulated linear periodic signal. A bridge circuit receives the controlled digital signals and outputs a balanced desired pulse coded signal which in turn is filtered by a filter circuit means which in turn outputs a desired amplified analog signal.

More particularly, in accordance with the present invention, the bridge circuit means of the amplifier comprises symmetrically disposed pairs of transistors, with each diagonally opposite pair of the transistors conducting for the same period of time to produce the balanced desired pulse coded signal.

In an alternative embodiment of the present invention, the bridge circuit means comprises pairs of symmetrically disposed parallel transistor circuits, the parallel transistor circuits having transistors connected in parallel, wherein each diagonally opposite pair of the parallel transistor circuits conduct for the same period of time to produce the balanced desired pulse coded signal.

BRIEF DESCRIPTION OF THE DRAWINGS

Numerous other objects, features and advantages of the invention should now become apparent upon a reading of the following detailed description taken in conjunction with the accompanying drawings, in which:

FIG. 3 is a component level circuit diagram of an alternative embodiment of the digital power amplifier;

FIG. 10 is a chart illustrating the outputs of the driver comparators for different input values.

DETAILED DESCRIPTION

In accordance with the present invention there is provided a simple switching digital power amplifier in which a modulated linear signal is generated to control the drivers of a bridge circuit, so that a balanced output will result.

Figure 1:
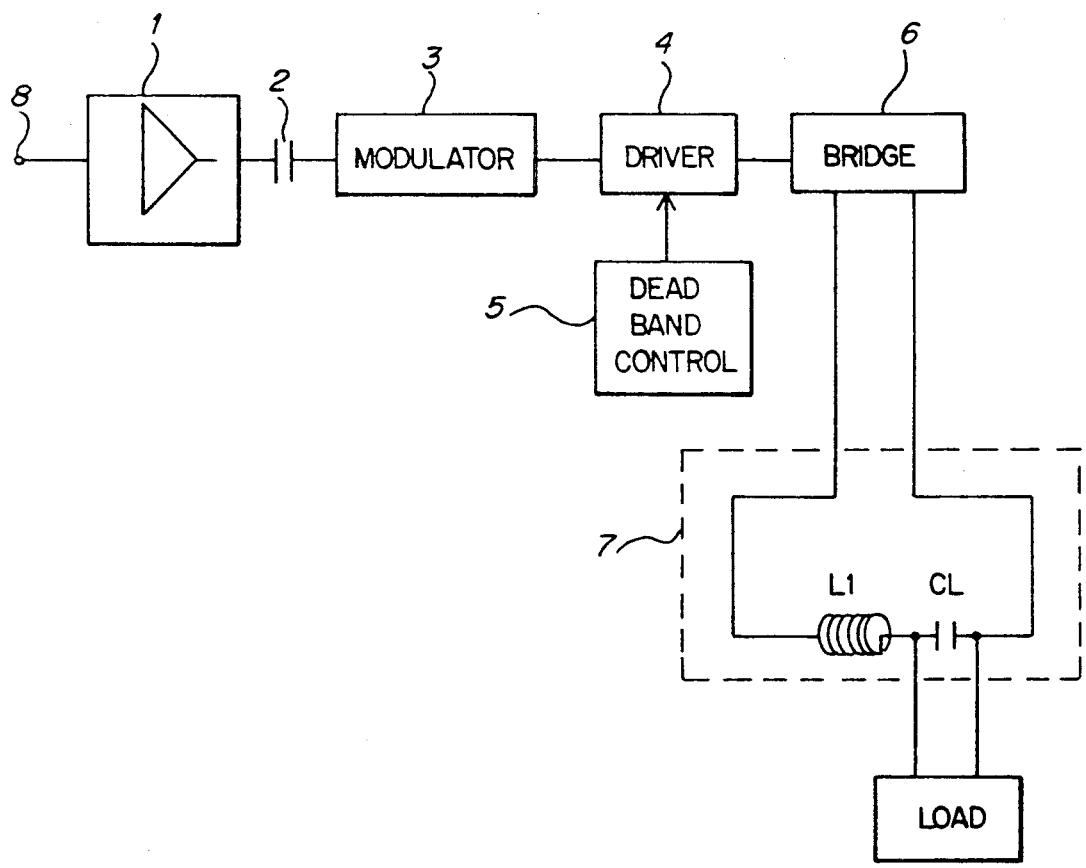
FIG. 1 is a block diagram of the digital power amplifier illustrating the main components thereof.
Figure 2:
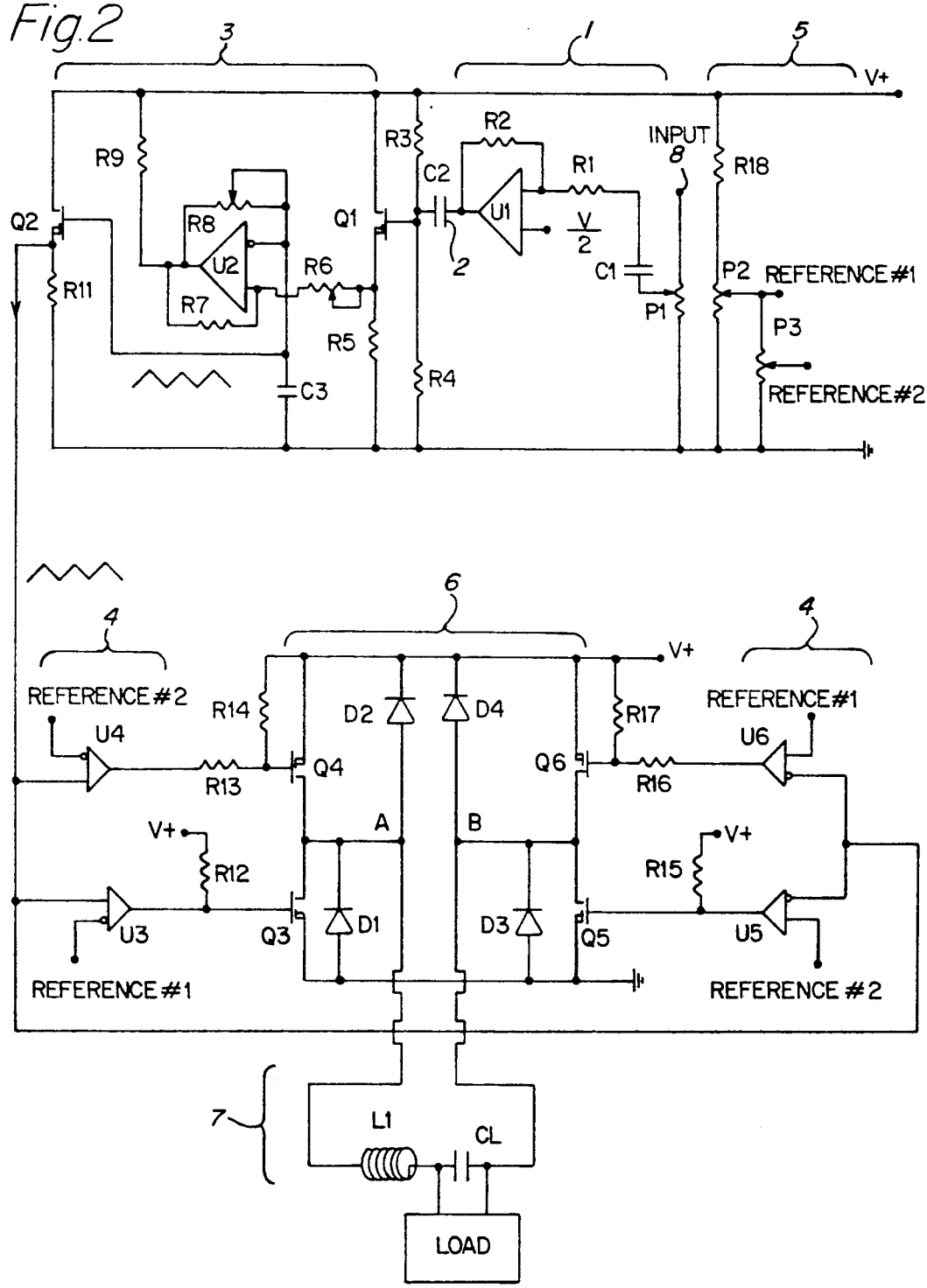
FIG. 2 is a component level circuit diagram of a preferred embodiment of the digital power amplifier.
Figure 4:
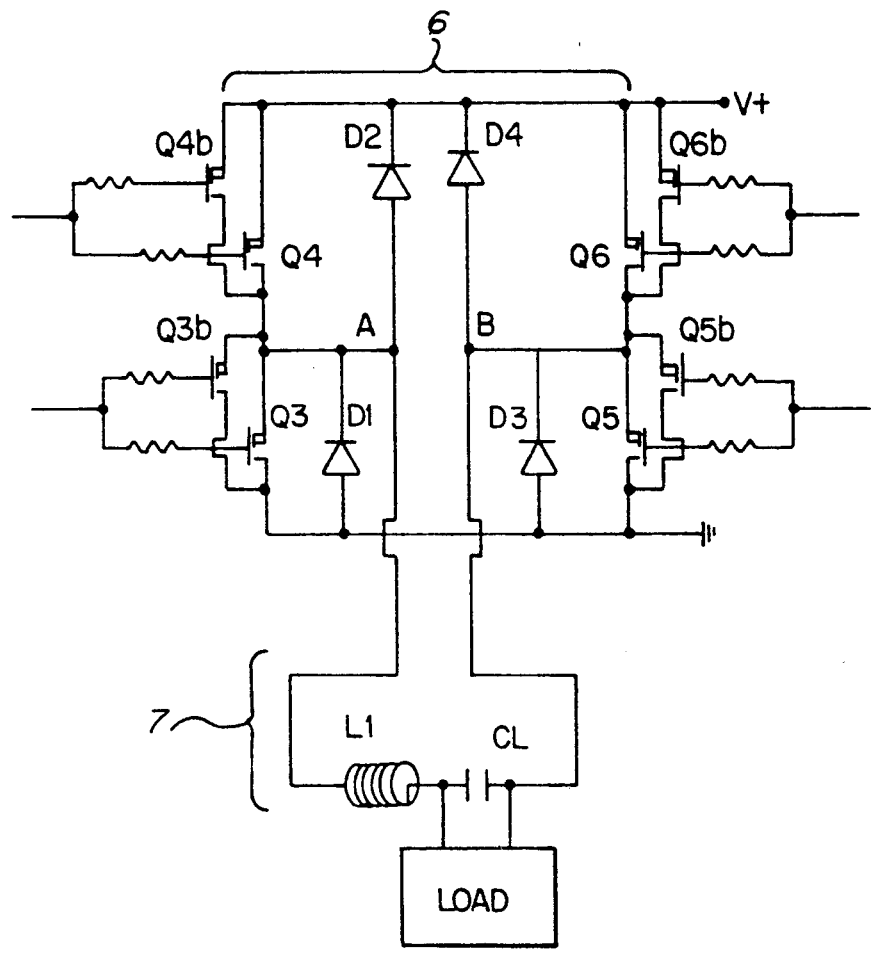
FIG. 4 is a component level circuit diagram of an alternative embodiment of the bridge circuit, illustrating both the alternative embodiment of the bridge circuit as well as the filter circuit.
Figure 5:
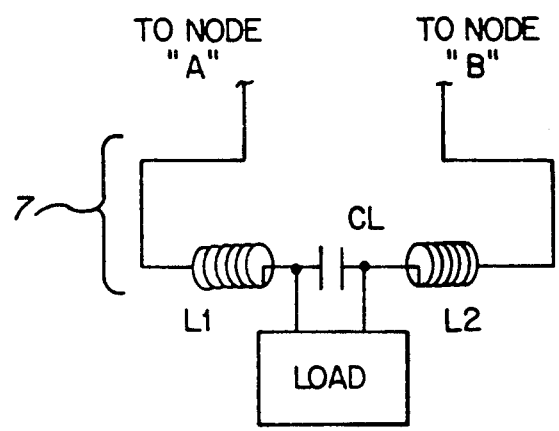
FIG. 5 is a component level circuit diagram illustrating an alternative embodiment of the filter circuit of the digital power amplifier.

Reference is now made to the drawings in which FIG. 1 illustrates a block diagram of the main components of the present invention. FIG. 2 illustrates further details through a circuit level diagram, of a preferred embodiment of the present invention. FIGS. 3-5 illustrate further details of alternate embodiments of the present invention. FIGS. 6-9 are timing diagrams which illustrate the behavior of certain components during operation. FIG. 10 illustrates the values of the bridge circuit transistors for certain input values.

Referring now in particular to FIG. 1, a block diagram of the present invention is shown, in which an input signal is applied at the input node 8 of a preamplifier 1. The output of the preamplifier is coupled via a capacitor 2 to a modulator circuit 3. The output of the modulator circuit 3 is then coupled to a dual complimentary driver circuit 4 which has a dead band generator 5. The outputs of the dual-complimentary driver circuit 4 are used to switch a complimentary full bride circuit 6. The push pull output of the bridge circuit 6 is connected to a filter circuit 7 which converts a pulse coded signal into a desired amplified analog signal.

Referring now to the more detailed circuit diagram of FIG. 2, a preferred embodiment of the present invention will be described. The input signal applied to input node 8 can be adjusted with potentiometer P1 before being applied to the preamplifier U1. The preamplifier U1 amplifies the adjusted input signal and the output is coupled via capacitor C2 to modulator circuit 3. Modulator circuit 3 consists of a free-running oscillator. Transistor Q1 is an impedance converter for the modulator circuit 3. Transistor Q1 is biased by resistors R3 and R4 to match the output of preamplifier U1. This matching ensures that capacitor C2 does not charge when there is no signal at input node 8. The source of transistor Q1 provides the reference voltage Vref for the free running oscillator. This free-running oscillator consists of comparator U2, resistors R6, R7, R8 and R9 and capacitor C3. Component values are chosen such that, in the absence of an input signal, and hence no output signal from preamplifier U1, the oscillator has a very high constant frequency. A free-running frequency of above 40 kilohertz provides an adequate range for audio circuits. Lower frequencies may be used for non-audio applications. Higher frequencies provide greater efficiencies for the latter and output stages of the amplifier as will be described further herein. The voltage across capacitor C3 varies at the oscillator frequency.

With an audio or low frequency signal applied to the input node 8 of the preamplifier U1, an amplified signal appears at the output of preamplifier U1, across capacitor C2 and at the node between resistors R3 and R4. This signal changes the voltage appearing at the source of transistor Q1 which in turn changes the reference voltage Vref for the free running oscillator. Please note that the input signal may be varied by use of potentiometer P1 before it is applied to the input of the preamplifier U1. In addition, please note that the reference voltage Vref of the oscillator can be adjusted by use of potentiometer R6.

Figure 6:
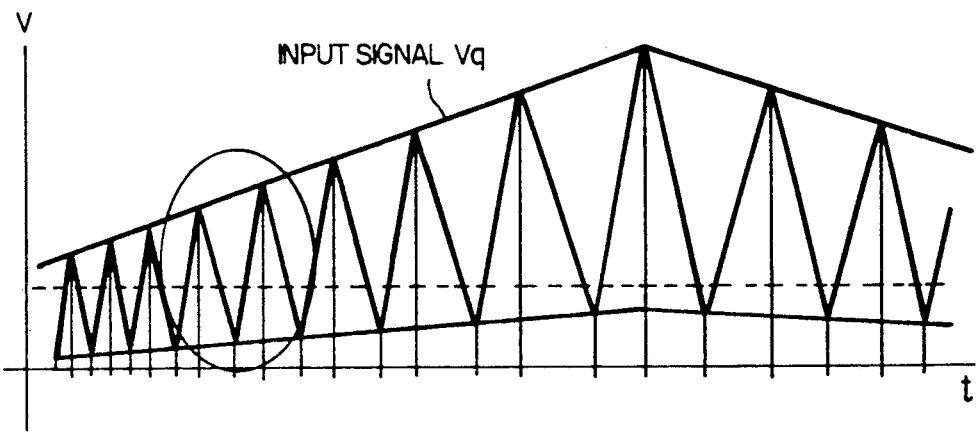
FIG. 6 is a timing diagram illustrating the input signal to the modulator circuit and the output signal from the modulator circuit.
Figure 7:
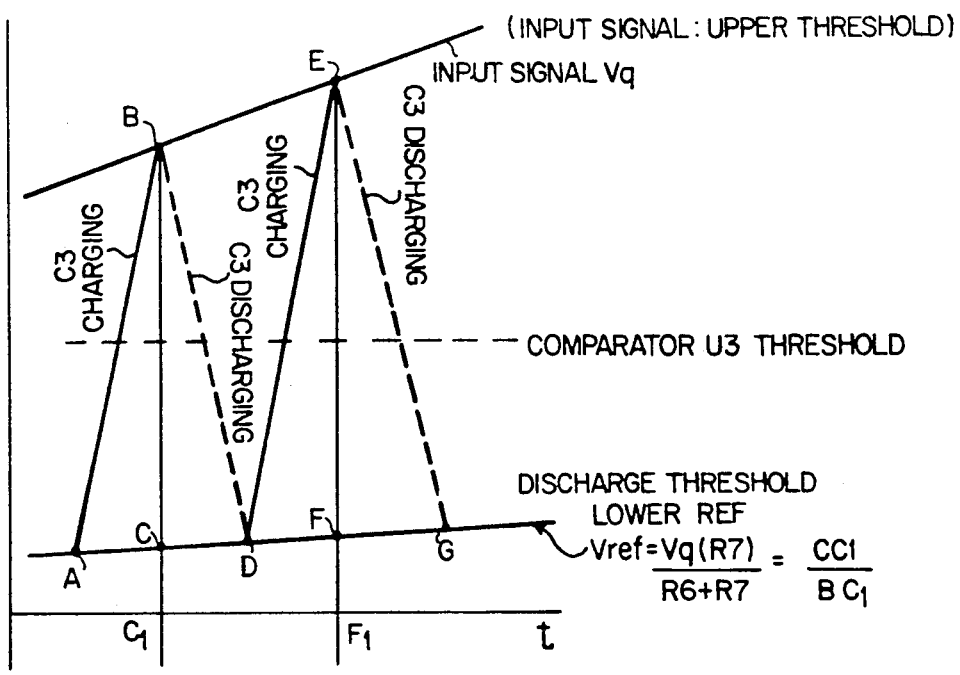
FIG. 7 is a close-up of a short period of time of the input and output signals of FIG. 6 from the modulator portion circuit, particularly illustrating the oscillator capacitor charging and discharging behavior with respect to the upper and lower oscillator reference voltages and the driver comparator threshold voltage.

Referring now to FIGS. 6 and 7, these timing diagrams illustrate the effect of a triangular input signal Vq on the frequency and waveform of the voltage cross capacitor C3, where Vq is the instantaneous voltage appearing at the source of transistor Q1. Referring to FIG. 6, the triangular input signal Vq is shown as an umbrella to the charging and discharging voltage waveform of the capacitor, also shown. FIG. 7 illustrates in more detail a short time period of the timing diagram of FIG. 6. The reference voltage Vref has both a high value, to which the capacitor C3 will charge before comparator U2 changes state, and a low value to which capacitor C3 will discharge before the comparator U2 will again change state. As can be seen in FIG. 7, the upper value of the reference voltage Vref is controlled by the input signal Vq. The lower reference voltage Vref can be determined by the voltage divider equation $Vref = Vq \times R7 / R6 + R7$. Capacitor C3 will initially charge, starting at point A of FIG. 7, via resistors R9 and R8 until it reaches the reference voltage Vref, which is continuously changing due to the triangular input signal Vq. Note that the reference voltage Vref is changing relatively slowly compared to the time constant of the oscillator, which is determined by the values of R9, R8 and C3. When the reference voltage Vref is reached, such as at point B of FIG. 7, the output of comparator U2 goes low. At this point, capacitor C3 begins discharging.

It would be expected that as the reference voltage Vref is increasing and the voltage across the capacitor is decreasing (due to a discharging), the output of comparator U2 will immediately switch back to high until the voltage across capacitor C3 again reaches the reference voltage. This would result in a very high frequency oscillation. When the output of comparator U2 goes low, however, the reference voltage Vref is driven low due to the effect of the feedback resistors R7 and R6 dragging the reference voltage lower. The net effect of this is that the pulse width of the capacitor voltage waveform is widened.

At time C in FIG. 7, capacitor C3 begins to discharge via resistor R8 to ground (U2 output low). When the output of comparator U2 goes low, resistors R7 and R6 are in parallel with resistor R5. The non inverted input of comparator U2 is now at a potential determined by the input signal and the instantaneous voltage there is given by the equation: $Vref = Vq \times (R7) / (R6 + R7)$, where Vref is the reference signal to which C3 must discharge before commencing its charge cycle and Vq is the instantaneous voltage appearing at the source of transistor Q1 which is in turn dependent on the input signal. Having R6 as a potentiometer instead of as a fixed value resistor, the reference voltage Vref can be adjusted over a range of values.

The waveforms of FIGS. 6 and 7 reveal the following:

1. If the frequency of the input signal Vq increases, the slope of the input signal waveform will increase. This will result in a longer time for the capacitor to charge to the upper reference voltage Vref. At the same time there will be fewer charge and discharge cycles for a given time period as the input signal Vq will be changing more rapidly;

2. If the amplitude of the input signal Vq increases, it will take longer for the capacitor C3 to charge to the upper reference voltage Vref. This will result in a longer charge time. This shows that by varying the frequency of the input signal, the number of the charge/discharge cycles can be controlled. Similarly, by varying the amplitude of the input signal Vq, the charge/discharge times can also be controlled.

Referring now to FIG. 3, an alternative embodiment of the modulator circuit portion of present invention is shown and will be described herein. In this alternative embodiment, steering diodes D5 and D6 are employed to increase the RC time constant of the oscillator, which in turn increases the pulse width of the voltage waveform across the capacitor C3. Capacitor C3 charges via diode D5 and resistor R8. Capacitor C3 discharges through diode D6 and resistor R8B. The discharge path has a higher time constant than the charge path. This allows for controlling the minimum width of the pulse of the voltage across the capacitor C3. This in turn relaxes the switching speed requirements for the driver circuit 4, as the voltage waveform across the capacitor feeds into the driver circuit.

The driver circuit 4 consists of comparators U3, U4, U5, and U6, as illustrated in FIGS. 2 and 3. The bridge circuit 6, which is controlled by the driver circuit, consists of the symmetrical arrangement of transistor pairs including transistors Q3, Q4, Q5, and Q6. The driver and bridge circuits can be seen in FIGS. 2 and 3.

In prior art, such as published applications for motor control, digital signals are used as inputs to the driver circuit which controls the bridge circuit operation. The amplifier of the present invention does not require using digital signals for this purpose, due the uncertainty of the threshold level of the comparators of the driver circuit, and complexity and relative lack of control that digital signals provide.

Referring to FIG. 2 or 3, it can be seen that the driver circuit is comprised of a symmetrical array of comparators, U3, U4, U5 and U6. Each comparator is used to drive a transistor in the bridge circuit 6. The output from the bridge circuit 6 is fed across points A and B, and then through the filter circuit 7 before being dissipated across the load.

If a digital signal was applied to the input of the comparators U3, U4, U5 and U6, as is done in prior art amplifiers, no dead band would exist and cross conduction would occur between the complimentary transistor pairs, Q3-Q4 and Q5-Q6. This results in an unbalanced, uncontrolled output from the bridge circuit; an undesirable result. This problem has been combatted in the prior art through the us of delay circuits, flip flops and comparators. These solutions, however, provide for very complex and expensive circuits. The present invention solves this very problem by producing a modulated linear periodic signal, feeding this signal to the input of the comparators, which very simply provides an infinitely controlled dead band to suit the characteristics of the bridge circuit 6. With respect to the bridge circuit, this allows for the threshold levels of the comparators to be selected such that each diagonally opposite pair of transistors conduct for the same period of time to give a balanced output in the presence of the signal of constant frequency. The constant frequency is used to adjust the balance of the circuit.

Referring to the modulator circuit 3 in FIG. 3, any impedance connected across capacitor C3 would cause a change in the frequency of the output waveform and may even cause a loss in oscillation. As it is required to extract an output from across the capacitor C3, an impedance converter transistor Q2 is used. Resistor R11 provides the source load for the source follower transistor Q2. The output of transistor Q2 therefore is a buffered output of the waveform generated across capacitors C3. This so-called "source follower" may be eliminated if the comparators U3 through U6 of driver circuit 4 have a very high input impedance. The essentially triangular output waveform of capacitor C3 is used to switch each set of diagonally opposite comparators, U3 through U6, set at different threshold voltages. The potentiometers P2 and P3 allow the threshold voltages of the comparators U3 through U6 to be set. Two distinct output signals, controlled by potentiometers P2 and P3, are fed to the input of comparators U3 through U6. The threshold voltages of these comparators are set such that no two transistor pairs Q3-Q4 or Q4-Q5, conduct simultaneously. This procedure is a simple, adjustable dead time control procedure.

The buffered output waveform from impedance converter transistor Q2 is connected to the driver circuit 4. The driver circuit, consisting of comparators U3 through U6, produces outputs used to drive the transistors of the bridge circuit 6. The threshold voltages of the comparators U3 through U6, which determine the threshold levels at which point the comparators will switch states, are tied to a dead band generator. The dead band generator consists of resistor R18, potentiometer P2, and potentiometer P3. Potentiometer P2 is the adjustment for reference voltage number 1, which sets the threshold voltage level for comparators U3 and U6. Potentiometer P3 is the adjustment for reference voltage number 2, which sets the threshold voltage level for comparators U4 and U5. Both threshold voltages can therefore be adjusted. The difference in the two voltage levels creates the so called dead band for the comparators. The comparators produce switched digital outputs, which are used to drive the transistors of the bridge circuit.

Figure 8:
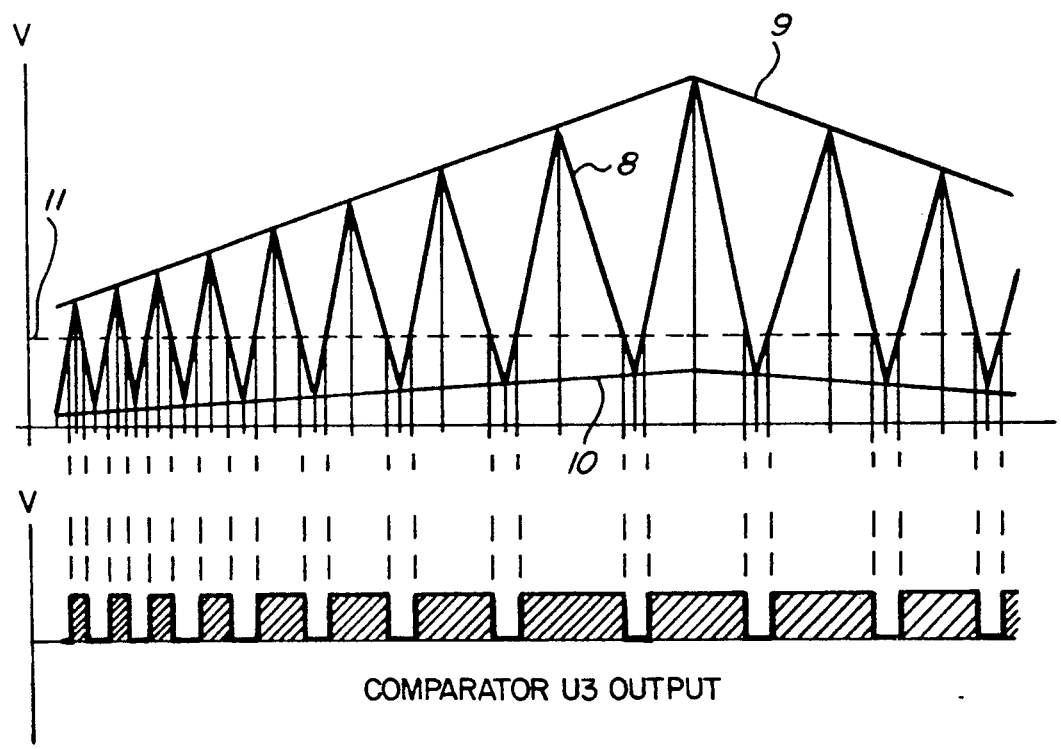
FIG. 8 is a timing diagram of voltage versus time illustrating the output of a driver comparator with respect to the timing diagram of the modulator circuit.

Referring now to FIG. 8, the timing diagram illustrates how the output from impedance converter transistor Q2 interacts with a comparator threshold voltage to give a switched digital output from the comparator. Referring to FIG. 8, triangular waveform 9 represents the input signal Vq to the modulator circuit, which acts as the upper reference voltage Vref for the oscillator, triangular waveform 10 represents the lower reference voltage Vref for the oscillator, waveform 8 represents the buffered output waveform from the impedance converter Q2 and constant waveform 11 represents the threshold voltage for comparator U3. Below that is shown the switched digital output from comparator U3. As can be seen, the pulse width increases with increased amplitude of the output waveform 8. The greater the amplitude of the output waveform 8 across Q2, above the threshold voltage level of comparator U3, the wider the pulse of the output waveform of the comparator is. In addition, if the frequency of the output waveform 8 is changed, the pulse groupings from the comparator output will also change.

The switched digital outputs from the comparators U3 through U6 of the driver circuit 4 are used to drive the transistors Q3 through Q6 of the bridge circuit 6. As it is important that the pairs of transistors do not switch simultaneously, the dead band is adjusted such that this does not occur. The following describes how this is achieved.

Figure 9:
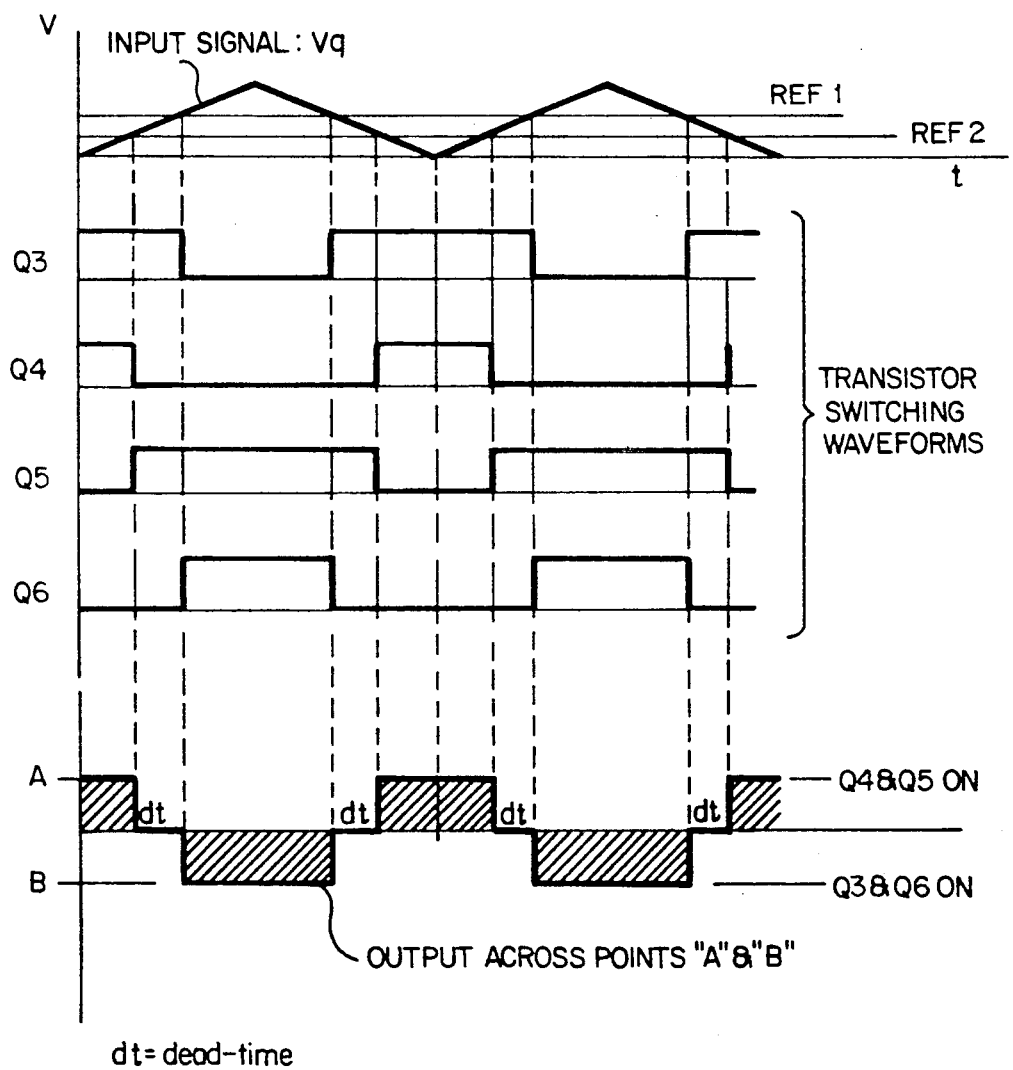
FIG. 9 is a timing diagram of voltage versus time illustrating the modulator circuit input signal behavior, the behavior of each of the four transistors of the bridge circuit, well as the ultimate bridge circuit output signal behavior.

An example will be used to describe how the drive circuit 4 operates. Consider the voltage of the opposite pair of comparators U3 and U6 set at the same reference voltage of 3.2 volts and pair U4 and U5 set at a different reference voltage of 3 volts. The important criteria is that the upper comparator switches off before the lower comparator switches on. This avoids cross conduction between the upper and lower drive transistors of the bridge circuit 6. Referring now to FIG. 10, with the input to the comparators at zero volts, the table illustrates how the voltages change at comparator outputs and bridge circuit transistors. The table goes on to illustrate how these outputs react for different input voltages. Referring now to FIG. 9, this timing diagram translates these voltages into waveforms. As illustrated in FIG. 9, the output across each transistor with respect to time is shown relative to the input signal Vq of the modulator circuit as well as the output across points A and B of the bridge circuit. As can be seen, the effect of setting the threshold voltages for the comparators as done, and inputting a modulated linear periodic signal to the comparators, is that transistors Q4 and Q5 switched together and transistors Q3 and Q6 switch together. A result of this is that point A of the bridge circuit is at a high voltage level and point B of the bridge circuit is at a low voltage level. Referring to the timing diagram of FIG. 9, initially point A is high until transistors Q4 and Q5 switched together, at which time point A goes low. There is then a dead time before transistors Q3 and Q6 switch together. At the point when transistors Q3 and Q6 switch together point B then goes high (to a low voltage level) The net effect of this is to alternately cause a voltage reversal between points A and B. If, for example, a 24 volt DC power supply is used, the voltage appearing across point A and B would be an alternating voltage of 48 volts peak to peak. This alternating voltage in effect eliminates the need for using a transformer where a stepped-up voltage is not required.

Referring to the bridge circuit 6 of FIG. 2, the diodes D1, D2, D3, and D4 are so called catch diodes to steer the reverse voltage, as generated by the load across points A and B, to the appropriate rails.

The voltage waveform appearing across points A and B is essentially rectangular and at the same frequency as that of the free running oscillator of the modulator circuit 3. This is a high frequency, well out of the audio frequency range. Because the transistors are switched very fast between the on and off states, there is very little dissipation, unlike linear amplifiers where the transistors are normally in an intermediate conducting state. Therefore, little dissipation occurs, not much power is lost, and an efficient use results.

If a load was placed directly across points A and B of the bridge circuit, the full voltage would be to dissipate it across this load, thus causing a high power drain. In order to eliminate this problem, a filter circuit 7 is placed across points A and B of bridge circuit 6, as illustrated in FIGS. 2 and 3 The filter circuit 7 consists of an inductor L1 and a capacitor CL. The inductor L1 provides a high impedance to the high frequencies and the capacitor CL provides a high impedance to the lower audio frequencies. Because of the waveform across points A and B is rectangular, and is at a high frequency, the inductor L1 provides greater attenuation and acts as a differentiator circuit. In addition, the inductor L1 will pass the lower audio frequencies to the capacitor CL which will attenuate them. Thus, if a load responsive to lower frequencies, such as a resistive or inductive load, were placed across the capacitor CL, the signal containing the lower audio frequencies would be shunted into this load. Thus, if a speaker coil was provided as the load, the audio frequencies would be routed via the capacitor to the coil for audio signal reproduction.

Normally, with the high free-running frequency, a very small proportion of the waveform across points A and B would be routed via the load, because the high frequencies would be attenuated by the inductor and the capacitor C would only shunt the low frequency signals. With a modulated audio signal, the inductor would strip most of the high frequency signal and the capacitor CL would provide a low impedance to the audio signal, thus allowing the signal to power the load across CL. The audio signal would appear across the capacitor CL and would be used to drive the speaker or other load.

While this disclosure has described applications for audio systems, it is not limited to this application. Any frequency signal can be conditioned by the amplifier of this invention to provide a highly efficient power output drive. The circuit of the present invention may be used for motors or any control or amplification function. In addition, the circuit can be used as an inexpensive transformerless step down circuit. The circuit of the present invention provides a very attractive means of stepping down any waveform without the distortion or other limitations associated with magnetic circuits such as frequency response, efficiency and size The power limitations of the present circuit are only dependent upon the drive transistors Q3 through Q6. There are available transistors handling over 100 amperes of current, which would allow extremely high power circuits to be constructed.

In addition, if V-MOS power transistors are used, a number of these transistors can be driven in parallel. This would multiply the power handling capacity of the circuit. If V-MOS transistors are used, it would allow for any number of power drive stages, which could be slaved into a single driver circuit. This would result in a very inexpensive means of providing multiple outputs.

Referring now to FIG. 4, an alternative embodiment of the present invention, employing multiple driver stages slaved into a single drive circuit, is shown. All that is shown in the diagram is the bridge circuit stage 6, and the filter circuit 7. The remaining portions of the power amplifier would be identical to those already described, and shown in FIGS. 2 and 3. The bridge circuit of this alternative embodiment employs an array of transistor circuits. Each of these transistor circuits consist of two transistors connected in parallel. For example, what was formerly transistor Q3 in FIG. 2, is now replaced by a transistor circuit consisting of a transistor Q3 connected in parallel with a transistor Q3b. The same substitution is provided for transistors Q4 through Q6. Any number of V MOS transistors can be driven depending upon the drive capacity of the complimentary drive to their input.

A further alternative embodiment, involving an improvement to the filter circuit, is shown in FIG. 5. As shown in FIG. 5, the alternative embodiment of the filter circuit 7, employs the addition of another inductor L2. This addition provides an improvement in filtering the higher frequencies.

Having now described a limited number of embodiments of the invention, it should now be apparent to those skilled in the art that numerous other embodiments and modifications thereof are contemplated as falling within the scope of the present invention as defined by the appended claims.

What is claimed is:

1. A digital power amplifier comprising:
   means for receiving an analog input signal;
   modulator means for modulating said analog input signal, said modulator means having oscillator means for generating a modulated linear periodic signal and being dependent upon a reference voltage, wherein said reference voltage changes value when said oscillator means changes state;
   driver means for producing controlled digital signals, said driver means receives the modulated linear periodic signal from said modulator means and outputs said controlled digital signals, said controlled digital signals being dependent upon said modulated linear periodic signal;
   bridge circuit means for receiving said controlled digital signals and outputting a balanced desired pulse coded signal; and
   filter circuit means for filtering said pulse coded signal and outputting a desired amplified analog signal.

2. A digital amplifier as set forth in claim 1, wherein said bridge circuit means comprises symmetrically disposed pairs of transistors, and each diagonally opposite pair of said transistors conduct for the same period of time to produce said balanced desired pulse coded signal.

3. A digital amplifier as set forth in claim 1, wherein said oscillator means comprises a capacitor, said reference voltage having a high value and a low value, said capacitor charges to said high value of said reference voltage and discharges to said low value of said reference voltage, thereby generating a modulated linear periodic signal, wherein said oscillator means changes state when said capacitor reaches said reference voltage, and further wherein said reference voltage changes value when said oscillator means changes state due to feedback means extending from an output of said oscillator means and feeding into said reference voltage.

4. A digital amplifier as set forth in claim 3, wherein said oscillator means further comprises at least one variable resistor, said at least one variable resistor used for controlling said reference voltage,
   said oscillator means generates a modulated linear periodic signal both in the presence and absence of said analog input signal, wherein the period of said modulated linear periodic signal in the absence of said input signal may be varied by varying the resistance of said one or more variable resistors.

5. A digital amplifier as set forth in claim 3, wherein said oscillator means has a time constant; said oscillator means further comprises means for varying said time constant, wherein the period of said modulated linear periodic signal may be varied by varying said time constant.

6. A digital amplifier as set forth in claim 1, further including a high impedance converter disposed between said analog input signal and said modulator means, wherein said reference voltage is dependent upon said analog input signal.

7. A digital amplifier as set forth in claim 1, wherein said modulated linear periodic signal is a high frequency linearly varying waveform modulated in response to said changes in the reference voltage.

8. A digital amplifier as set forth in claim 1, wherein said driver means comprises threshold dependent switching circuits; said driver means receives said modulated linear periodic signal from said modulator means via a high impedance path between said modulator means and said driver means.

9. A digital power amplifier comprising:
   means for receiving an analog input signal;
   modulator means for modulating said analog input signal having oscillator means dependent upon a reference voltage for producing a modulated periodic linear signal;
   driver means for producing controlled digital signals, said driver means receives said modulated periodic linear signal and outputs said controlled digital signals, said controlled digital signals being dependent upon said modulated periodic linear signal;
   bridge circuit means which receive said controlled digital signals and output a balanced desired pulse coded signal, said bridge circuit means having symmetrically disposed pairs of transistors, wherein each diagonally opposite pair of said transistors, wherein each diagonally opposite pair of said transistors conduct for the same period of time to produce said balanced desired pulse coded signal; and
   filter circuit means for filtering said balanced desired pulse coded signal and outputting a desired amplified analog signal.

10. A digital amplifier as set forth in claim 9, wherein said reference voltage changes value when said oscillator means changes state.

11. A digital amplifier as set forth in claim 9, wherein said driver means comprises threshold dependent switching circuits, each of said threshold dependent switching circuits having a separate threshold voltage input; and
   further including means for varying each of said threshold voltages.

12. A digital amplifier as set forth in claim 11, wherein said means for varying comprises at least one variable voltage source connected to said threshold voltage inputs, said means for varying ensures that said each diagonally opposite pair of said transistors conduct for the same period of time.

13. A digital amplifier as set forth in claim 9, wherein said symmetrical pairs of transistors are driven in parallel by said driving means, said driving means being controlled by said modulator means.

14. A digital amplifier as set forth in claim 9, wherein said filter circuit means comprises an inductor and a capacitor for filtering the high frequency components of said balanced desired pulse coded signal an outputting said desired amplified analog signal across said capacitor, said digital power amplifier further comprising an output load connected across said capacitor for receiving said desired amplified analog signal.

15. A digital amplifier as set forth in claim 9, further including means for varying the amplitude of said analog input signal whereby the amplitude of said desired amplified analog signal may be controlled.

16. A digital amplifier as set forth in claim 9, wherein said driver means comprises symmetrically disposed pairs of comparators, each said comparators having two inputs, one input to each said comparators being a constant signal, the other input to each said comparators being said modulated periodic comparators is substantially identical.

17. A digital power amplifier comprising:

means for receiving an analog input signal;

modulator means for modulating said analog input signal and producing a modulated periodic linear signal, said modulator means comprising an oscillator means for generating said modulated periodic linear signal and being dependent upon a reference voltage, said reference voltage changes value when said oscillator means changes state: driver means for producing controlled digital signals, said driver means receives said modulated periodic linear signal and outputs said controlled digital signals, said controlled digital signals being dependent upon said modulated periodic linear signal;

bridge circuit means which receive said controlled digital signals and output a balanced desired pulse coded signal, said bridge circuit means having pairs of symmetrically disposed parallel transistor circuits, said parallel transistor circuits having transistors connected in parallel, wherein each diagonally opposite pair of said parallel transistor circuits conduct for the same period of time to produce said balanced desired pulse coded signal; and filter circuit means for filtering said balanced desired pulse coded signal and outputting a desired amplified analog signal.

* * * * *